United States Patent [19]

Voeten

[11] Patent Number: 4,899,259

[45] Date of Patent: Feb. 6, 1990

[54] ENCASED ELECTRIC COMPONENT

[75] Inventor: Hendrik Voeten, Zwolle, Netherlands

[73] Assignee: U.S. Philips Corporation, New York, N.Y.

[21] Appl. No.: 908,937

[22] Filed: Sep. 15, 1986

Related U.S. Application Data

[63] Continuation of Ser. No. 749,370, Jun. 27, 1985, abandoned.

[30] Foreign Application Priority Data

Jul. 17, 1984 [NL] Netherlands .......................... 8402251

[51] Int. Cl.$^4$ ............................................... H01G 9/00
[52] U.S. Cl. ................................................... 361/539
[58] Field of Search ...................... 29/570; 264/272.11, 264/272.18; 361/306, 308, 310, 402, 433

[56] References Cited

U.S. PATENT DOCUMENTS

| | | | |
|---|---|---|---|
| 3,236,936 | 2/1966 | Robinson | 264/272.18 X |
| 3,515,958 | 6/1970 | Claypoole et al. | 361/310 |
| 3,806,766 | 4/1974 | Fanning | 264/272.18 X |
| 3,819,340 | 6/1974 | Heier et al. | 29/570 |
| 4,205,365 | 5/1980 | Kalina | 361/308 |
| 4,247,883 | 1/1981 | Thompson et al. | 361/433 |
| 4,255,779 | 3/1981 | Meal | 361/308 |
| 4,288,842 | 9/1981 | Voyles | 29/570 X |
| 4,358,331 | 11/1982 | Schmidt et al. | 264/272.11 X |
| 4,417,298 | 11/1983 | Nakata et al. | 361/433 C |
| 4,578,737 | 3/1986 | Westermann | 361/308 |

Primary Examiner—Donald Griffin
Attorney, Agent, or Firm—Norman N. Spain

[57] ABSTRACT

Encased component which, using an electrically insulating moulding compound, is built into a box-like casing. At the short sides of the casing electrically conductive strips are folded over the edge, which strips contact the component on the inner side and form contact faces on the outer side to enable fixation, for example, in an electric wiring pattern.

1 Claim, 2 Drawing Sheets

ENCASED ELECTRIC COMPONENT

This is a continuation of application Ser. No. 749,370, filed June 27, 1985 and now abandoned.

BACKGROUND OF THE INVENTION

The invention relates to an encased electric component having contact faces at the ends of one of the boundary surfaces of the casing.

Such an encased component is known from U.S. Pat. No. 4 417 298. A component having contact faces at the ends of one of the boundary surfaces, instead of contact wires as customarily used in prior art applications, is much more suitable especially with regard to mounting on printed circuit boards. This so called chip-type component is much more suitable, especially with regard to automated mounting.

According to said patent specification, the electric component, using a moulding compound, is built into a prismatic casing which is made of an electrically insulating material, which casing is open on one side, and has contact faces at the ends of one of its boundary surfaces, which contact faces are conductively connected to the ends or the electrodes of the component.

The construction of the encased component comprises a prismatic casing which consists of an electrically insulating synthetic resin. Metal coatings are applied to two opposite surfaces of the casing, which coatings consist of suitably solderable metal. These metal coatings are conductively connected to the contacts of the component which are shaped either as a supply wire, which passed through a slit in the metal-coated casing and is soldered to the metal coating, or as a bracket if it concerns a contact face, which bracket is conductively connected to the contact face of the component as well as, over the edge or through a slit in the casing, to the other metal coating on the outside of the casing, one or two sides of which is (are) open. Subsequently, the component is potted by means of a synthetic resin of the same composition as the one used for the casing or by means of another synthetic resin which is compatible as regards coefficient of expansion and bonding. The metal coatings on opposite surfaces may extend beyond the lower side and across a portion of the bottom surface. They are thus present at the ends of one boundary surface of the encased component, which is thus extremely suitable for automated mounting on a printed circuit board.

BRIEF DESCRIPTION OF THE DRAWING

In the drawing

FIGS. 1a and 1b, 2a and 3a and 3b and 4a and 4b are perspective views and cross-sectional views, respectively, of this known structure. Reference numeral 1 denotes a component, 21 is the casing, 22 is the moulding compound, 31 and 32 are the metal coatings, 5 is the bent supply wire, 6 is a bracket which is passed through a slit and 17 is a bracket which extends over the edge.

This known construction is rather complicated and necessitates a rather elaborate manufacturing process. The slits complicate the potting process.

SUMMARY OF THE INVENTION

The invention provides a substantially simple embodiment whose manufacturing process is considerably less elaborate.

According to the invention, an encased electric component which, using an electrically insulating moulding compound, is built into a prismatic casing which is made of an electrically insulating material, which envelope is open on at least one side, and has contact faces at the ends of one of its boundary surfaces, which contact faces are conductively connected to the contacts of the component is characterized in that each contact face forms part of a strip of conductive material which extends from the boundary surface along the short side of the casing and is then folded inwards, between which parts the component is electrically conductively mounted at the inside.

DETAILED DESCRIPTION OF THE INVENTION

Figure 1:
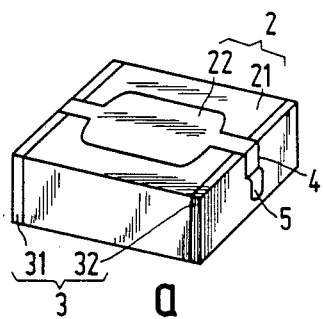
FIGS. 1a 2a and 3a and 1b, 2b and 3b are respectively perspective and corresponding cross-sectional views of prior art encased components.
Figure 1:
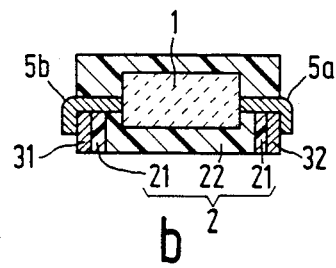
Figure 2:
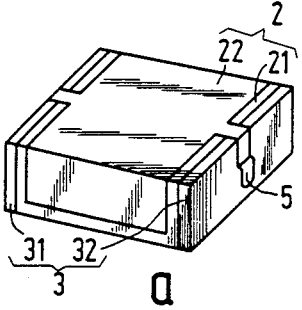
Figure 2:
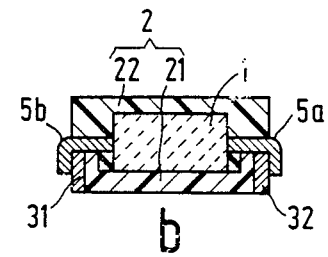
Figure 3:
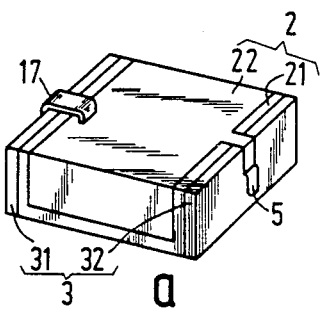
Figure 3:
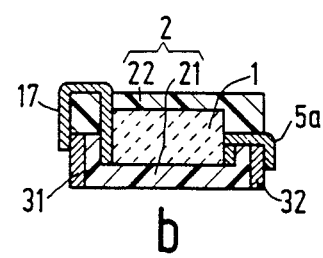
Figure 4:
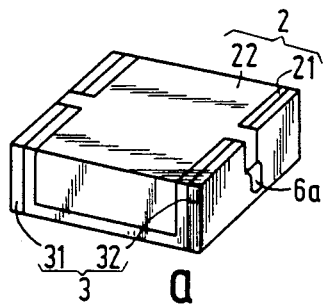
Figure 4:
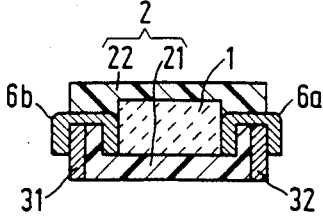
Figure 5:
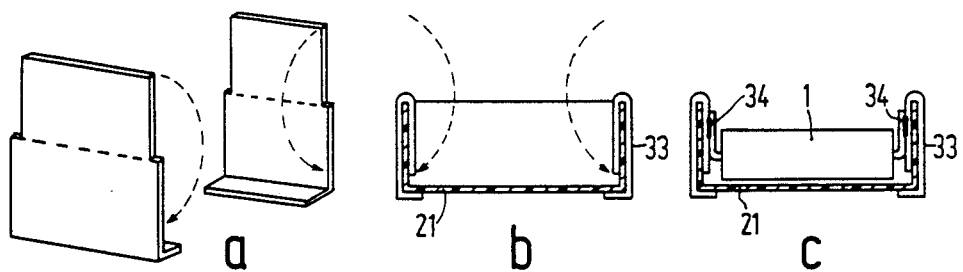
FIGS. 5a, 5b, 5c, 6a, 6b and 6c are perspective and cross-sectional views showing steps in the construction of an encased component of the invention.
Figure 6:
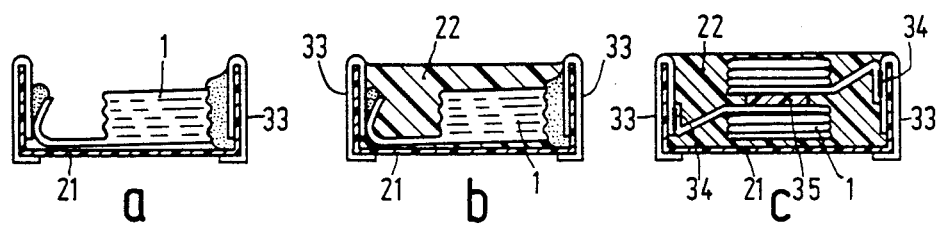

The invention will now be described in greater detail with reference to FIGS. 5 to 7.

FIG. 5a shows the metal strips (33) and the direction in which they are folded around the side of a casing (21) so that the situation as shown in FIG. 5b is obtained. The component (1) is placed between the parts of the metal strips (33) within the casing (21); after shortening, if required, the supply wires are secured by means of solder or an electrically conductive paste (34) or by means of welding.

FIGS. 6a and 6b show an encased embodiment, in accordance with the invention, a solid electrolytic capacitor (1) having an anode body from a folded strip of aluminium.

This embodiment is described in U.S. Pat. No. 3 819 340. As shown in FIG. 6b, the assembly, including the contact strips 33, is accommodated in envelope 21 which is filled with potting compound 22. In a preferred embodiment the casing consists of polyester filled with glass fibres, which polyester is resistant to soldering, i.e. exposure to a temperature of 270° C. for 10 seconds should not cause any damage to the polyester. Preferably, the potting compound consists of an epoxy resin. In another advantageous embodiment the potting compound consists of a lacquer, curable by U.V. radiation.

FIG. 6c shows a bipolar embodiment of two solid aluminium capacitors from a folded strip which are interconnected by way of the cathode sides. The anode ends and the two cathode sides are connected, using 34 and 35, respectively, and a conductive epoxy resin, for example, filled with nickel powder, to the contact surfaces 33 and to each other, respectively.

For this purpose, it is also possible to use a U.V. cured lacquer which has been rendered conductive.

Figure 7:
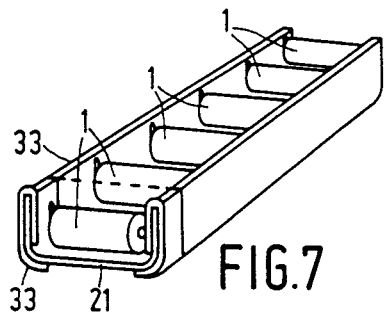
FIGS. 7, 8 and 9 are perspective views of various embodiments of the invention.

FIG. 7 shows how the encased parts are preferably manufactured in accordance with the invention. The parts (1) are suitably spaced between the two strip ends and subsequently secured electrically in a trough-shaped collective casing (21). This strip 33 is shaped so that it extends over the entire length of the collective casing. After securing the parts and filling the casing with a potting compound, the individual encased parts are sawn from the resulting bar along the lines x—x.

However, it may sometimes be useful to change components which have been encased according to the invention, into components comprising connecting wires or connecting strips because such a type is easier to handle than the original wire component.

Figure 8:
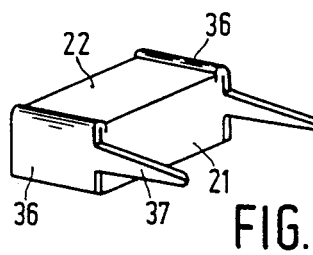
Figure 9:
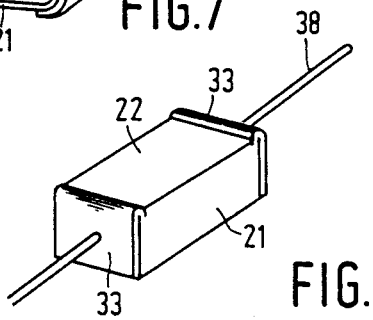

FIGS. 8 and 9 shows such modifications.

According to FIG. 8, the strip of conductive material 36 which is folded along the short sides of the casing 21 is provided with contact projections 37.

In FIG. 9, connecting wires 38 are welded to the strips of conductive material 33 which are folded inwards along the short sides of the casing 21.

What is claimed is:

1. An encased electric component provided with a pair of electrically conductive contacts, situated in a prismatic casing made of an electrically insulating material and separated from the inner surfaces of said casing by an electrically insulating molding material, said casing being open on at least one side, having a wall portion opposed to said open side bonded by two opposing end wall portions and having external contact faces situated at opposing ends of the external surface of said wall portion opposing said open side thereof, which contact faces are conductively connected to said pair of electrically conductive contacts provided on said component, characterized in that each of said external contact faces is part of a strip of conductive material extending along one of said ends, along the external surface of an adjacent end wall portion, along the external surface of an edge of said end wall portion adjacent to said open side and folded inwardly to extend along the inner surface of said adjacent end wall portion thereby to form a contact face inside of said casing and in that the electrically conductive contacts of the component are secured to the contact faces by means of a lacquer which has been rendered conductive and which has been cured by means of UV radiation.

* * * * *